(12) United States Patent
Dolganov et al.

(10) Patent No.: US 12,362,537 B2
(45) Date of Patent: Jul. 15, 2025

(54) DRIVER CIRCUIT FOR EVALUATION OF AN OPTICAL EMITTER

(71) Applicant: Lumentum Operations LLC, San Jose, CA (US)

(72) Inventors: Mikhail Dolganov, Gilroy, CA (US); Lijun Zhu, Pleasanton, CA (US); Sean Burns, Menlo Park, CA (US); Yuanzhen Zhuang, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 833 days.

(21) Appl. No.: 17/451,742

(22) Filed: Oct. 21, 2021

(65) Prior Publication Data

US 2023/0051475 A1  Feb. 16, 2023

Related U.S. Application Data

(60) Provisional application No. 63/260,260, filed on Aug. 13, 2021.

(51) Int. Cl.
*H01S 5/042* (2006.01)
*H01S 5/026* (2006.01)
*H01S 5/062* (2006.01)
*H01S 5/183* (2006.01)

(52) U.S. Cl.
CPC .......... *H01S 5/0428* (2013.01); *H01S 5/0261* (2013.01); *H01S 5/06216* (2013.01); *H01S 5/183* (2013.01)

(58) Field of Classification Search
CPC ....... H01S 5/042–0428; H01S 5/06216; H01S 5/06226
See application file for complete search history.

(56) References Cited

U.S. PATENT DOCUMENTS

| | | | | |
|---|---|---|---|---|
| 6,763,049 | B1 * | 7/2004 | Bees | H03K 3/53 372/57 |
| 7,969,558 | B2 * | 6/2011 | Hall | H01S 5/0428 356/141.5 |
| 8,467,283 | B2 * | 6/2013 | Fujita | H01S 5/06216 369/116 |
| 9,142,937 | B2 * | 9/2015 | Locklin | H01S 5/125 |
| 9,420,645 | B2 * | 8/2016 | Yan | H05B 45/375 |
| 11,495,941 | B1 * | 11/2022 | Luft | H01S 5/183 |
| 2006/0285563 | A1 * | 12/2006 | Hakomori | H01S 5/0683 372/38.07 |

(Continued)

*Primary Examiner* — Minsun O Harvey
*Assistant Examiner* — Fernanda Adriana Camacho Alanis
(74) *Attorney, Agent, or Firm* — Harrity & Harrity, LLP

(57) ABSTRACT

A driver circuit may include an optical emitter. The driver circuit may include a first switch that, in a closed state, is to cause charging of an inductive element, and when transitioning from the closed state to an open state is to cause discharging of the inductive element to charge a capacitive element. The driver circuit may include a second switch that in a closed state is to cause discharging of the capacitive element to provide an electrical pulse to the optical emitter. The driver circuit may include a signal generator configured to generate a first signal for controlling the open state and the closed state of the first switch, and a pulse shortening element configured to shorten a pulse width of the first signal to generate a second signal for controlling the open state and the closed state of the second switch.

20 Claims, 3 Drawing Sheets

(56) References Cited

U.S. PATENT DOCUMENTS

| | | | | |
|---|---|---|---|---|
| 2011/0243167 | A1* | 10/2011 | Castillo | H01S 5/06804 |
| | | | | 315/309 |
| 2020/0393543 | A1* | 12/2020 | David | G01S 7/4868 |
| 2022/0045479 | A1* | 2/2022 | Wagner | G01S 7/484 |
| 2022/0271502 | A1* | 8/2022 | Masuda | H01S 5/06233 |
| 2022/0360043 | A1* | 11/2022 | Schleifer | H01S 5/005 |

* cited by examiner

DRIVER CIRCUIT FOR EVALUATION OF AN OPTICAL EMITTER

CROSS-REFERENCE TO RELATED APPLICATION

This Patent Application claims priority to U.S. Provisional Patent Application No. 63/260,260, filed on Aug. 13, 2021, entitled "DRIVER FOR CHARACTERIZING LASER DIODES," and assigned to the assignee hereof. The disclosure of the prior Application is considered part of and is incorporated by reference into this Patent Application.

TECHNICAL FIELD

The present disclosure relates generally to evaluation of optical emitters and to a driver circuit for evaluation of an optical emitter.

BACKGROUND

A vertical-emitting device, such as a bottom-emitting or top-emitting vertical-cavity surface-emitting laser (VCSEL), is a laser in which a laser beam is emitted in a direction perpendicular to a surface of a substrate (e.g., vertically from a surface of a semiconductor wafer). A VCSEL device may be used for three-dimensional sensing, gesture recognition, range detection, or communication, among other examples. A typical VCSEL includes epitaxial layers grown on a substrate. The epitaxial layers may include, for example, a pair of reflectors (e.g., a pair of distributed Bragg reflectors (DBRs)), an active region, and/or an oxidation layer, among other examples. Other layers may be formed on or above the epitaxial layers, such as one or more dielectric layers, metal layers, or the like.

SUMMARY

In some implementations, a driver circuit includes an optical emitter; a capacitive element connected to the optical emitter; an inductive element connected to the capacitive element; a first switch having an open state and a closed state, where the first switch in the closed state is to cause charging of the inductive element, and where the first switch transitioning from the closed state to the open state is to cause discharging of the inductive element to charge the capacitive element; a second switch having an open state and a closed state, where the second switch in the closed state is to cause discharging of the capacitive element to provide an electrical pulse to the optical emitter; a signal generator configured to generate a first signal for controlling the open state and the closed state of the first switch; and a pulse shortening element configured to shorten a pulse width of the first signal to generate a second signal for controlling the open state and the closed state of the second switch.

In some implementations, a vertical cavity surface emitting laser (VCSEL) evaluation system includes a VCSEL; a capacitive element connected to the VCSEL; a voltage booster element connected to the capacitive element, where the voltage booster element includes an inductive element; a first switch having an open state and a closed state, where the first switch in the closed state is to cause charging of the inductive element, and where the first switch transitioning from the closed state to the open state is to cause discharging of the inductive element to charge the capacitive element; a second switch having an open state and a closed state, where the second switch in the closed state is to cause discharging of the capacitive element to provide an electrical pulse to the VCSEL; a signal generator configured to generate a first signal for controlling the open state and the closed state of the first switch; a pulse shortening element configured to shorten a pulse width of the first signal to generate a second signal for controlling the open state and the closed state of the second switch; a current sense resistive element in series between the voltage booster element and the VCSEL; and a voltage peak detection circuit configured to detect a voltage level at the capacitive element.

In some implementations, an optical source includes a VCSEL; a capacitive element connected to the VCSEL; a voltage booster element connected to the capacitive element, where the voltage booster element includes an inductive element; a first switch having an open state and a closed state, where the first switch in the closed state is to cause charging of the inductive element, and where the first switch transitioning from the closed state to the open state is to cause discharging of the inductive element to charge the capacitive element; a second switch having an open state and a closed state, where the second switch in the closed state is to cause discharging of the capacitive element to provide an electrical pulse to the VCSEL; a signal generator configured to generate a first pulse width modulation (PWM) signal for controlling the open state and the closed state of the first switch; and a pulse shortening element configured to shorten a pulse width of the first PWM signal to generate a second PWM signal for controlling the open state and the closed state of the second switch.

DETAILED DESCRIPTION

Figure 1:
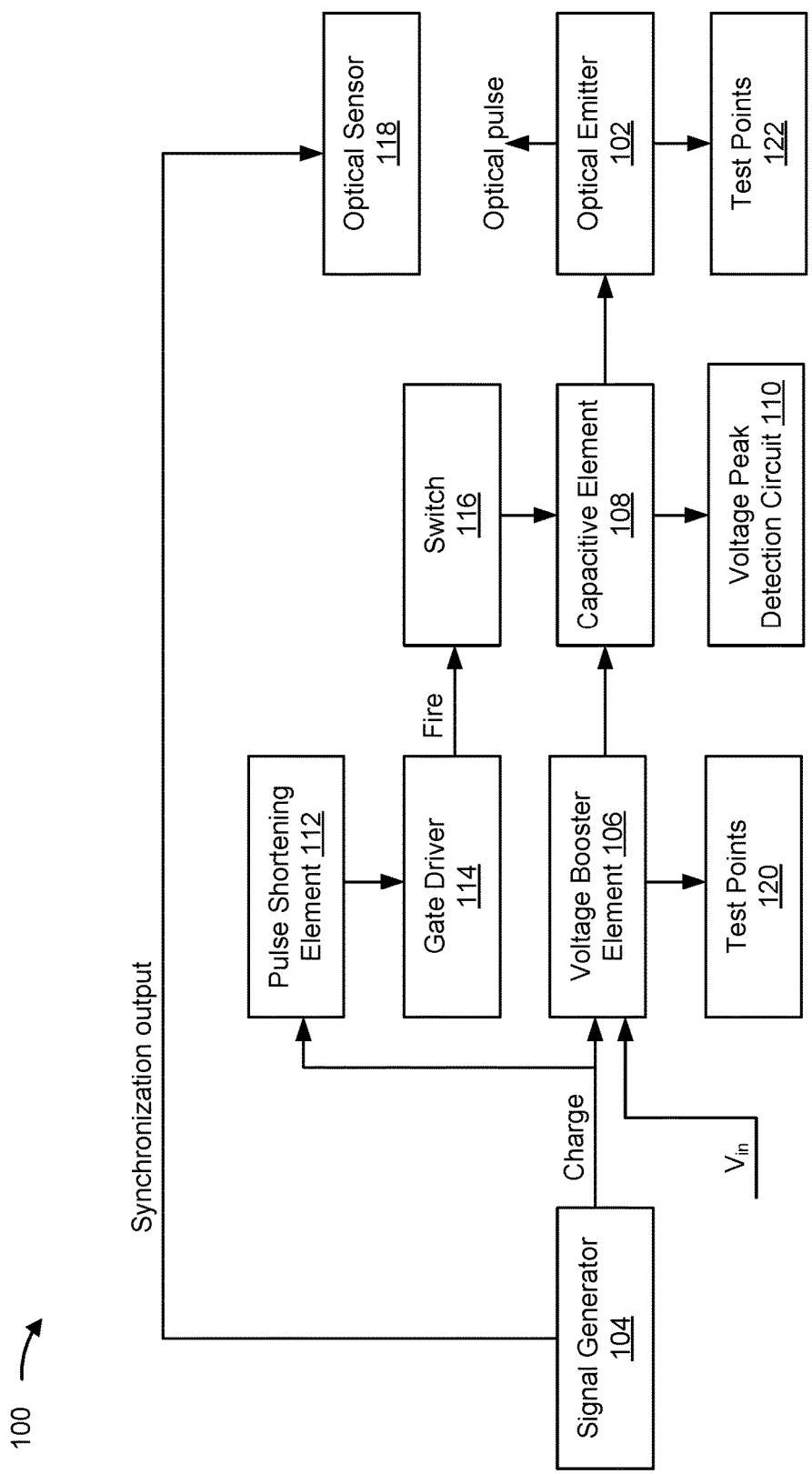
FIG. 1 is a diagram of an example evaluation system described herein.

The following detailed description of example implementations refers to the accompanying drawings. The same reference numbers in different drawings may identify the same or similar elements.

The performance of an optical emitter, such as a vertical cavity surface emitting laser (VCSEL), may be evaluated using an evaluation system. Measurements obtained during evaluation of a VCSEL may dictate the design of driver circuitry for the VCSEL. For example, the driver circuitry may be designed (e.g., based on the measurements) to utilize the VCSEL to a full potential, which may be useful in light detection and ranging (LIDAR) applications. In some cases, an evaluation system may employ a high-speed, short-pulse generating device and an external high-voltage power supply for VCSEL evaluation (e.g., evaluation of the VCSEL for use in connection with LIDAR applications). Accordingly, the evaluation system may be bulky and excessively complex. Moreover, the evaluation system (e.g., operating in a switching mode) may be unable to generate clean, Gaussian-shaped pulses without generating secondary pulses and/or unintended laser forward bias. As a result, measurements that are obtained using the evaluation system may be inaccurate.

Some implementations described herein provide a driver circuit that facilitates optical pulse generation and measurement. In some implementations, the driver circuit may include an optical emitter, a capacitive element configured to discharge to the optical emitter, and a voltage booster element that includes an inductive element configured to discharge to the capacitive element. In addition, the driver circuit may include a signal generator configured to generate a first signal for controlling a first switch that controls charging of the inductive element, and a pulse shortening element configured to shorten a pulse width of the first signal to generate a second signal for controlling a second switch that controls discharging of the capacitive element.

The driver circuit may be configured to generate a single, clean, Gaussian-shaped, nanosecond optical pulse. That is, the driver circuit may generate an optical pulse associated with faster rise time, and without also generating unwanted (e.g., secondary) current pulses, which facilitates improved measurement and characterization of the optical emitter. Moreover, the driver circuit may be configured to generate nanosecond pulses (e.g., for direct time of flight (dTOF) applications) with high optical power (e.g., up to 600 watts (W)) and with an adjustable frequency of repetition rate (e.g., in a range from (e.g., greater than or equal to) 62 kilohertz to (e.g., less than or equal to) 1 megahertz), an adjustable pulse width (e.g., in a range from 1 nanosecond (ns) to 7 ns), and/or an adjustable peak current (e.g., in a range from 1 amp (A) to 200 A).

In addition, the driver circuit may synchronously drive the first switch that controls charging of the inductive element and the second switch that controls discharging of the capacitive element to facilitate a resonant mode of operation of the driver circuit (e.g., to produce a Gaussian-shaped optical pulse). For example, the single signal generator of the driver circuit, that generates a signal used for controlling charging of the voltage booster element and discharging of the capacitive element, provides optimization of the timing of charging and discharging the capacitor. In this way, the circuitry of the driver circuit is less complex, and delays between optical pulses are minimized because a charging cycle of the voltage booster element starts at the same time as the second switch is closed to discharge the capacitive element. This enables faster optical pulse frequency to facilitate collection of additional data points and/or to produce, for encoding purposes, additional optical pulses in a burst to mitigate sensor-to-sensor interference. Moreover, the driver circuit may operate autonomously (e.g., to generate optical pulses and provide measurement functionality) through the application of a single input voltage, and without an external signal generator or high-voltage power supply (e.g., which add complexity and bulkiness). For example, the driver circuit may operate using a single external voltage source of 6 volts (V) (e.g., in contrast to a typical LIDAR driver and VCSEL evaluation system that requires a high voltage power supply that is complex and bulky).

In some implementations, the driver circuit may be included in an evaluation circuit board and/or an evaluation system (e.g., for LIDAR evaluation). For example, measurement information used for characterizing the optical emitter (e.g., a VCSEL), such as an electrical pulse peak current and voltage drop and a peak voltage of the driver circuit, is available on-board. Thus, the driver circuit enables simplified and improved evaluation of the optical emitter. For example, the driver circuit enables capture and evaluation of a nanosecond optical pulse using only a high-speed optical sensor (e.g., without use of an external signal generator or high-voltage power supply, as described above).

FIG. 1 is a diagram of an example evaluation system 100 described herein. The evaluation system 100 may facilitate evaluation, characterization, and/or measurement of an optical emitter 102. The optical emitter 102 may include a light-emitting diode (LED), a laser diode, a semiconductor laser diode, a VCSEL, and/or an edge-emitting emitter (e.g., an edge-emitting laser), among other examples. Thus, for example, the evaluation system 100 may be a VCSEL evaluation system.

The evaluation system 100 may include a signal generator 104. The signal generator 104 may include an oscillator, a pulse width modulator, or the like. The signal generator 104 may be configured to generate a first signal (shown as "charge"), such as a pulse width modulation (PWM) signal. The evaluation system 100 may include a voltage booster element 106 and a capacitive element 108. The voltage booster element 106 may include an inductive element (not shown).

The first signal from the signal generator 104 may control charging and discharging of the inductive element of the voltage booster element 106. For example, charging of the inductive element may begin at a rising edge of a pulse of the first signal. From a falling edge of the pulse, the inductive element may discharge current to the capacitive element 108 (e.g., thereby charging the capacitive element 108). In some implementations, the evaluation system 100 may include a voltage peak detection circuit 110 configured to detect a peak voltage at the capacitive element 108.

The evaluation system 100 may include a pulse shortening element 112 (e.g., a pulse shortening circuit). The pulse shortening element 112 may be configured to shorten a pulse width of the first signal from the signal generator 104 to generate a second signal (e.g., having a shortened pulse width relative to the first signal from the signal generator). The second signal may control a gate driver 114 for a switch 116. The switch 116 may control discharging of the capacitive element 108 to the optical emitter 102. Discharging of the capacitive element 108 to the optical emitter 102 may provide an electrical pulse to the optical emitter 102. In response to the electrical pulse, the optical emitter 102 may emit an optical pulse.

The optical pulse may be detected by an optical sensor 118 to facilitate characterization of the optical emitter 102. In some implementations, the first signal generated by the signal generator 104 may be output to circuitry associated with the optical sensor 118 to provide synchronization of detection of the optical pulse with emission of the optical pulse. In some implementations, the evaluation system 100 may include a current sense resistive element (not shown) configured to enable detection of an average current (e.g., based on a voltage drop across the current sense resistive element). In some implementations, the evaluation system 100 may include a set of electrical test points 120 configured to enable collection (e.g., using a probe) of measurements relating to the average current (or the voltage drop). A peak current may be calculated from the average current by dividing the average current by a duty cycle, where the duty cycle corresponds to the optical pulse width divided by a pulse period. In some implementations, the evaluation system 100 may include a set of electrical test points 122 configured to enable collection of measurements relating to a voltage at the optical emitter 102 (e.g., a voltage drop across the optical emitter 102).

As indicated above, FIG. 1 is provided as an example. Other examples may differ from what is described with regard to FIG. 1.

Figure 2:
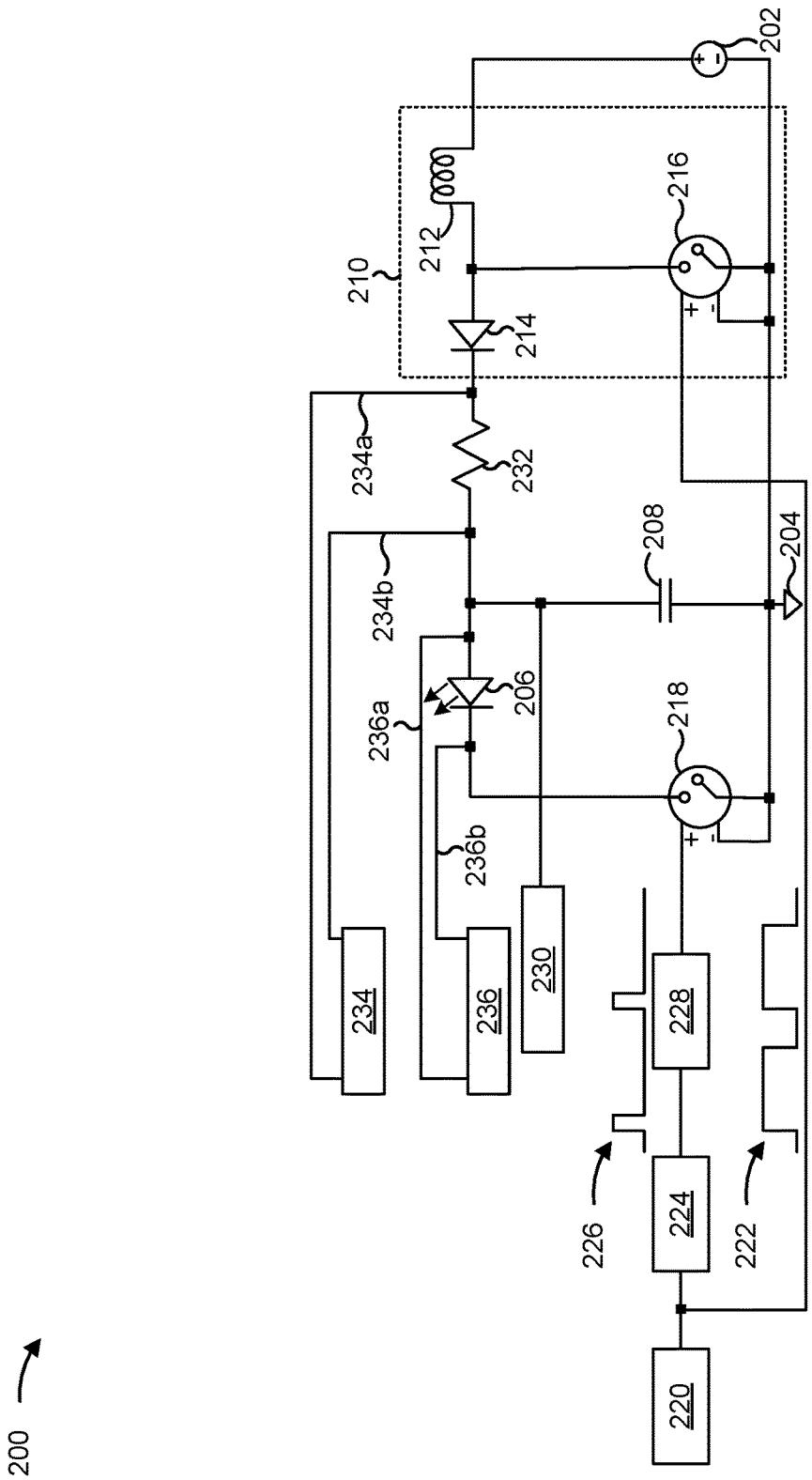
FIG. 2 is a diagram of an example driver circuit described herein.

FIG. 2 is a diagram of an example driver circuit 200 described herein. The driver circuit 200, or a portion thereof, may be included in the evaluation system 100. In some implementations, the driver circuit 200, or a portion thereof, may be included in an evaluation circuit board (e.g., a printed circuit board). Here, the evaluation circuit board may be included in the evaluation system 100.

The driver circuit 200 may include a set of electronic components interconnected by current-carrying conductors (e.g., traces). The driver circuit 200 may include a source 202. The source 202 may provide an electrical input of the driver circuit 200. For example, the source 202 may provide current to the driver circuit 200. The source 202 may be a direct current (DC) voltage source, a DC current source with a resistive load, or the like. As described above, the source 202 may be external to the driver circuit 200. The driver circuit 200 may include a ground 204. The driver circuit 200 may include an optical emitter 206, in a similar manner as described above. In some implementations, the driver circuit 200 may be configured to provide an electrical pulse to the optical emitter 206, and thereby produce an optical pulse of the optical emitter 206, using a single external voltage source (e.g., source 202) of less than or equal to 20 V, less than or equal to 10 V, or less than or equal to 6 V.

The driver circuit 200 may include a capacitive element 208 (e.g., a capacitive voltage source). The capacitive element 208 may include a capacitor configured to store energy in response to current flowing through the capacitor, and configured to discharge the stored energy from the capacitor. In some implementations, the capacitive element 208 may include one or more capacitors. The capacitive element 208 may have an electrical capacitance in a range from about (e.g., ±1%) 1 nanofarad to 100 nanofarads.

The capacitive element 208 may be connected to (e.g., in a circuit path with) the optical emitter 206. Thus, the capacitive element 208 may operate as a voltage source for the optical emitter 206. In some implementations, the capacitive element 208 may be directly connected (e.g., in series) to the optical emitter 206 (e.g., at an anode side of the optical emitter 206). For example, no other circuit components may be in a circuit path between the capacitive element 208 and the optical emitter 206.

The driver circuit 200 may include a voltage booster element 210 (e.g., configured to boost an input voltage). The voltage booster element 210 may include an inductive element 212. The inductive element 212 may include an inductor configured to store energy in response to current flowing through the inductor, and configured to discharge the stored energy from the inductor as current. In some implementations, the inductive element 212 may include one or more inductors. The inductive element 212 may have an electrical inductance in a range from about 0.5 nanohenries (nH) to 10 microhenries (µH). A peak current of the driver circuit 200 is controlled by the voltage booster element 210, which is adjustable (e.g., based on a charging time of the inductive element 212) and produces a higher voltage (e.g., up to 200 V) from a lower input voltage (e.g., 6 V).

The voltage booster element 210 may be connected to (e.g., in a circuit path with) the capacitive element 208. For example, the inductive element 212 may be connected to (e.g., in a circuit path with) the capacitive element 208, and the inductive element 212 may be configured to discharge current to the capacitive element 208. In some implementations, the voltage booster element 210 may include a diode 214 (e.g., a blocking diode). A diode 214 of the voltage booster element 210 may be in series between the inductive element 212 of the voltage booster element 210 and the capacitive element 208 (e.g., the inductive element 212 may be configured to discharge current to the capacitive element 208 through the diode 214). The diode 214 ensures discharge of the capacitive element 208 along a desired circuit path. In this way, the voltage booster element 210 operates as a current source for the capacitive element 208.

The driver circuit 200 may include a first switch 216 (which may be referred to herein as a charging switch 216). The inductive element 212 may be connected to (e.g., in a circuit path with) the charging switch 216. As described below, the charging switch 216 may control charging of the inductive element 212. The charging switch 216 may be a field effect transistor (FET). For example, the FET may be a gallium nitride (GaN) FET, a complementary metal-oxide-semiconductor (CMOS) FET, or the like.

As shown, a charging circuit path of the driver circuit 200 may include the source 202, the inductive element 212, and the charging switch 216. The charging switch 216 may have a closed state (e.g., an on state) where, when the charging switch 216 is in the closed state, current may flow through the charging switch 216. Additionally, the charging switch 216 may have an open state (e.g., an off state), where, when the charging switch 216 is in the open state, current may not flow through the charging switch 216. The charging switch 216 may transition to the closed state in response to a "charge" signal (e.g., high voltage). The charging switch 216 may transition to the open state in response to a "discharge" signal (e.g., low voltage).

In the closed state, the charging switch 216 may cause current to charge the inductive element 212 connected to the charging switch 216 (e.g., by completing a circuit path that includes the source 202, the inductive element 212, and the charging switch 216). That is, when the charging switch 216 is in the closed state, current may flow through the charging switch 216 and charge the inductive element 212.

In some implementations, when the charging switch 216 is in the closed state, current may flow through the charging switch 216 and charge the inductive element 212 for a duration (e.g., a charging time interval). The duration may be in a range from 50 ns to 150 ns, 80 ns to 120 ns, 100 ns to 110 ns, or the like. When transitioning from the closed state to the open state, the charging switch 216 may cause the inductive element 212 to discharge current to the capacitive element 208 connected to the inductive element 212. That is, when the charging switch 216 is in the open state, current may not flow through the charging switch 216, and current discharges from the inductive element 212 to the capacitive element 208.

The driver circuit 200 may include a second switch 218 (which may be referred to herein as a discharging switch 218). The optical emitter 206 may be connected to (e.g., in a circuit path with) the discharging switch 218. As described below, the discharging switch 218 may control the optical emitter 206 (e.g., by completing a cathode path of the optical emitter 206). The discharging switch 218 may be a FET (e.g., an n-type FET). For example, the FET may be a GaN FET, a CMOS FET, or the like. The discharging switch 218 may be a low side switch. In some implementations, the discharging switch 218 may be capable of operation in the closed state (e.g., capable of transitioning from the open state to the closed state, and subsequently transitioning from the closed state to the open state) for a time duration in a range from 0.5 ns to 10 ns. In some implementations, the discharging switch 218 may be a high-speed switch (e.g., may have a faster switching speed than the charging switch 216).

As shown, a discharging circuit path of the driver circuit 200 may include the capacitive element 208, the optical emitter 206, and the discharging switch 218. The discharging switch 218 may have a closed state (e.g., an on state)

where, when the discharging switch 218 is in the closed state, current may flow through the discharging switch 218. Additionally, the discharging switch 218 may have an open state (e.g., an off state), where, when the discharging switch 218 is in the open state, current may not flow through the discharging switch 218. The discharging switch 218 may transition to the closed state in response to a "fire" signal (e.g., high voltage). The discharging switch 218 may transition to the open state in response to an "off" signal (e.g., low voltage).

Thus, in the closed state, the discharging switch 218 may cause discharging of the charged capacitive element 208 to provide an electrical pulse to the optical emitter 206. For example, in the closed state, the discharging switch 218 may close (e.g., complete) a cathode path of the optical emitter 206 to cause current to flow through the optical emitter 206.

In some implementations, when the discharging switch 218 is in the closed state, current may flow through the discharging switch 218 and discharge the capacitive element 208 for a duration (e.g., a discharging time interval). The duration may be in a range from 1 ns to 10 ns, 1 ns to 7 ns, 1 ns to 5 ns, or the like. Moreover, a duration for which the capacitive element 208 is discharged may be based on an optical pulse width that is to be produced for the optical emitter 206.

The driver circuit 200 may include a signal generator 220 (e.g., an oscillator, a pulse width modulator, or the like). In a similar manner as described above, the signal generator 220 may be configured to generate a first signal 222, such as a PWM signal. The first signal 222 may control the open state and the closed state of the charging switch 216. For example, pulses (e.g., high voltage) of the first signal 222 may cause the charging switch 216 to transition to the closed state.

The driver circuit 200 may include a pulse shortening element 224 (e.g., a pulse shortening circuit). In a similar manner as described above, the pulse shortening element 224 may be configured to shorten a pulse width (e.g., a duration of a pulse) of the first signal 222 from the signal generator 220 to generate a second signal 226, such as a PWM signal. In some implementations, the pulse shortening element 224 may include circuitry that provides a delayed circuit path for the first signal 222 relative to a non-delayed circuit path for the first signal 222. Further, the pulse shortening element 224 may include a logic gate, such as a logic AND gate, that receives a signal of the delayed circuit path and a signal of the non-delayed circuit path, and outputs the second signal 226 based on a delay associated with the delayed circuit path.

The second signal 226 may have a shortened pulse width relative to the first signal 222. For example, the first signal 222 may have a first pulse width, and the second signal 226 may have a second pulse width that is less than the first pulse width. Accordingly, a rising edge of a pulse of the first signal 222 may be time aligned with a rising edge of a pulse of the second signal 226, while a falling edge of the pulse of the first signal 222 may not be time aligned with a falling edge of the pulse of the second signal 226 (e.g., the falling edge of the pulse of the second signal 226 may be before the falling edge of the pulse of the first signal 222). The second signal 226 may control the open state and the closed state of the discharging switch 218. For example, pulses (e.g., high voltage) of the second signal 226 may cause the discharging switch 218 to transition to the closed state. In some implementations, the driver circuit 200 may include a gate driver 228 for the discharging switch 218 (e.g., for providing a signal to a gate of the discharging switch 218), and the gate driver 228 may control the open state and the closed state of the discharging switch 218 based on the second signal 226. The gate driver 228 may facilitate fast switching of the discharging switch 218, and the gate driver 228 may provide high sourcing and sinking currents (e.g., 7 A and 5 A, respectively) with fast rise and fall times (e.g., in hundreds of picoseconds).

In some implementations, the driver circuit 200 may include a first signal generator for generating the first signal 222 and a second signal generator for generating the second signal 226 Here, the driver circuit 200 may omit the pulse shortening element 224. The first signal generator and the second signal generator may be time synchronized (e.g., such that the capacitive element 208 is fully charged before discharge of the capacitive element 208 is triggered).

In an example operation of the driver circuit 200, the charging switch 216 may transition from the open state to the closed state (e.g., for a duration of a pulse, also referred to herein as a "charge" signal, of the first signal 222) to cause current (e.g., from the source 202) to charge the inductive element 212 (e.g., for a particular duration). Continuing with the example, the charging switch 216 may transition from the closed state to the open state (e.g., for a duration between pulses, also referred to herein as a "discharge" signal, of the first signal 222) to cause the inductive element 212 to discharge current (e.g., through the diode 214) to the capacitive element 208 to charge the capacitive element 208. Thereafter (e.g., in a subsequent cycle), the discharging switch 218 may transition from the open state to the closed state (e.g., for a duration of a pulse, also referred to herein as a "fire" signal, of the second signal 226) to cause discharging of the capacitive element 208 (e.g., a discharge of energy from the capacitive element 208) to provide an electrical pulse to the optical emitter 206. In response to the electrical pulse, the optical emitter 206 may emit an optical pulse (e.g., having a duration in a range from 1 ns to 10 ns, 1 ns to 7 ns, 1 ns to 5 ns, or the like). An amplitude of the optical pulse may be controlled by a first duration for which the inductive element 212 is charged (e.g., for which the charging switch 216 is in the closed state), and a width of the optical pulse may be controlled by a second duration for which the discharging switch 218 is in the closed state.

In some implementations, the electrical pulse provided to the optical emitter 206 is Gaussian-shaped. For example, the driver circuit 200 may be configured to operate in a resonant mode based on discharging of the capacitive element 208. Operation in the resonant mode may reduce the rise time of the electrical pulse. Moreover, by operating in the resonant mode, the driver circuit 200 may achieve peak currents for the electrical pulse using the capacitive element 208 that has a relatively small capacitance, thereby facilitating miniaturization of the driver circuit 200.

A capacitance value for the capacitive element 208 may be selected to achieve a particular pulse width (e.g., from 1 ns to 10 ns, from 1 ns to 7 ns, or the like). Moreover, the capacitance value of the capacitive element 208 and the pulse width of the second signal 226 may be configured such that, after the electrical pulse is provided to the optical emitter 206, a difference between an anode side voltage and a cathode side voltage (e.g., the cathode side voltage subtracted from the anode side voltage) of the optical emitter 206 is less than a forward voltage threshold of the optical emitter 206. In this way, between pulses, the optical emitter 206 is not forward biased above the forward voltage threshold, which would result in the optical emitter 206 consuming excessive power and/or producing a secondary optical pulse. Accordingly, the driver circuit 200 facilitates improved current measurement.

The pulse width of the second signal 226 may be based on a configuration of the pulse shortening element 224 (e.g., a delay of the delayed circuit path of the pulse shortening element 224). If the pulse width of the second signal 226 is too long, the cathode side voltage of the optical emitter 206 (e.g., the drain voltage of the discharging switch 218) may drop below the anode side voltage of the optical emitter 206 by more than the forward voltage threshold, thereby causing the optical emitter 206 to conduct current during charging of the capacitive element 208 (e.g., due to drain-source parasitic capacitance of the discharging switch 218) and produce unwanted power consumption and/or uncontrolled light emission. Conversely, if the pulse width of the second signal 226 is too short, energy stored at the drain of the discharging switch 218 due to parasitic inductance may lead to a drain-source voltage of the discharging switch 218 that is excessively high, and in some cases, exceeding a maximum rated drain-source voltage of the discharging switch 218.

The driver circuit 200 may include one or more elements that facilitate measurement of a voltage or a current associated with the driver circuit 200. In some implementations, the driver circuit 200 may include a voltage peak detection circuit 230 (e.g., sense circuitry). The voltage peak detection circuit 230 may be connected to the driver circuit 200 in a circuit path between the capacitive element 208 and the optical emitter 206. The voltage peak detection circuit 230 may be configured to detect a peak voltage level at the capacitive element 208. In some implementations, the voltage peak detection circuit 230 may be configured to scale a dangerously high voltage potential (e.g., up to 200 V) to a safe lower voltage (e.g., from 1 V to 5 V). Thus, the voltage peak detection circuit 230 may detect a peak voltage that is representative of the voltage in the circuit path at the beginning of a discharge of the capacitive element 208. In some implementations, the driver circuit 200 may include a current sense resistive element 232. The current sense resistive element 232 may be located (e.g., in series) between the voltage booster element 210 and the optical emitter 206 (e.g., between the diode 214 and the optical emitter 206).

In some implementations, the driver circuit 200 may include one or more (e.g., a plurality of) sets of electrical test points 234, 236 (e.g., electrical connection points). A set of test points 234, 236 may include a set of electrical contacts, a set of electrical connectors, or the like. Moreover, a set of test points 234, 236 may be configured for connecting a probe, or the like, to the driver circuit 200 for obtaining a measurement relating to a voltage or a current in the driver circuit 200.

In some implementations, the driver circuit 200 may include a first set of test points 234 that include a first test point 234a at an input side of the current sense resistive element 232 and a second test point 234b at an output side of the current sense resistive element 232. The first set of test points 234 may facilitate measurement of an average current associated with the driver circuit 200 (e.g., based on a voltage drop that is detected across the current sense resistive element 232, and which may be used to determine a peak current in a similar manner as described above). In some implementations, the driver circuit 200 may include a second set of test points 236 that include a first test point 236a at an input side of the optical emitter 206 and a second test point 236b at an output side of the optical emitter 206. The second set of test points 236 may facilitate measurement of a voltage associated with the optical emitter 206 (e.g., based on a voltage drop that is detected across the optical emitter 206). In this way, the collection of information for characterizing the optical emitter 206 (e.g., peak current, peak voltage, and voltage drop across the optical emitter) is provided on-board the driver circuit 200.

In some implementations, an optical source (e.g., for three-dimensional sensing (3DS) or LIDAR) may include the driver circuit 200 or a portion thereof. In some implementations, an optical system may include the driver circuit 200 or a portion thereof. Moreover, the optical system may include one or more lenses, one or more optical elements (e.g., diffractive optical elements, refractive optical elements, or the like), one or more reflector elements, and/or one or more optical sensors, among other examples.

In some implementations, the driver circuit 200 or a portion thereof may be included in a time of flight (ToF)-based (e.g., direct ToF or indirect ToF) measurement system. For example, the ToF-based measurement system may include a LIDAR system. According to some implementations, a method may include generating an optical pulse for ToF-based measurement using the driver circuit 200 or a portion thereof, and/or detecting an object based on the optical pulse. According to some implementations, a method may include generating (or forming) an array of light spots for 3DS using the driver circuit 200 or a portion thereof. According to some implementations, a method may include generating (or forming) a light pattern for 3DS using driver circuit 200 or a portion thereof.

As indicated above, FIG. 2 is provided as an example. Other examples may differ from what is described with regard to FIG. 2.

Figure 3:
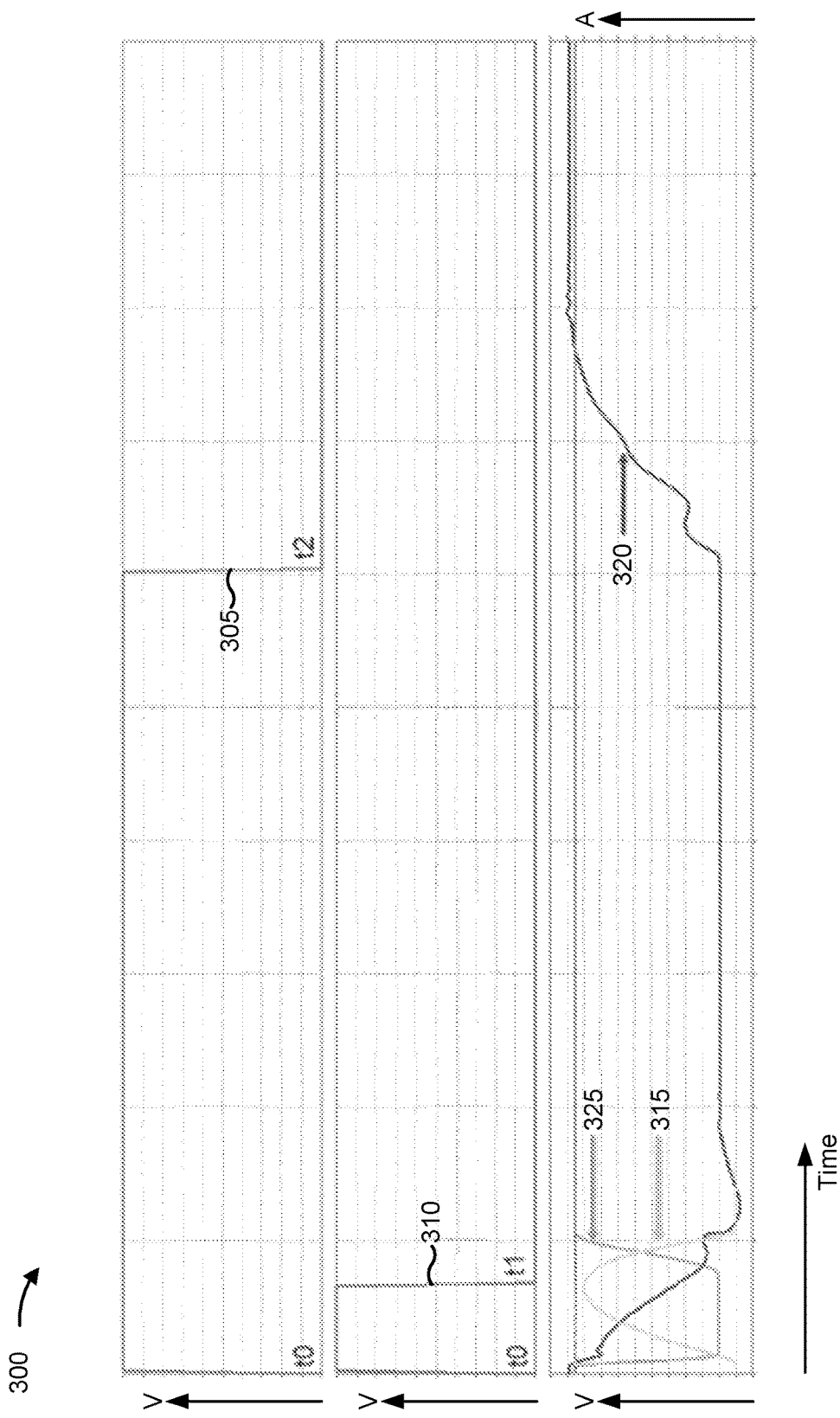
FIG. 3 is a diagram of example graphs plotting electrical signals associated with the driver circuit described herein.

FIG. 3 is a diagram of example graphs 300 plotting electrical signals associated with the driver circuit 200 described herein. In particular, the graphs 300 show the electrical signals associated with generating an optical pulse at the optical emitter 206.

As shown by line 305, when the charging switch 216 is closed, the inductive element 212 of the voltage booster element 210 is charged for a duration from time t0 to time t2 (e.g., corresponding to a pulse width of the first signal 222 generated by the signal generator 220). When the charging switch 216 is opened, stored energy from the inductive element 212 charges the capacitive element 208 (e.g., through diode 214, which prevents the capacitive element 208 from discharging into the closed charging switch 216 during a subsequent charging cycle).

As shown by line 310, when the discharging switch 218 is closed, the capacitive element 208 is discharged (e.g., based on a previous charging from the inductive element 212 occurring prior to time t0) for a duration from time t0 to time t1 (e.g., corresponding to a pulse width of the second signal 226 as adjusted from the first signal 222 by the pulse shortening element 224). This resonant mode of operation produces a Gaussian-shaped electrical pulse, shown by line 315, at the optical emitter 206.

Line 320 shows a voltage at the capacitive element 208 during discharging of the capacitive element (from time t0 to time t1) and during charging of the capacitive element (following time t2). Line 325 shows a drain voltage of the discharging switch 218. As shown, after discharging of the capacitive element 208 (following time t1), the drain voltage of the discharging switch 218 (e.g., a voltage level at the cathode side of the optical emitter 206) returns to a level that approximately corresponds to (e.g., within a threshold voltage, as described above) the voltage at the capacitive element 208 (e.g., a voltage level at the anode side of the optical emitter 206) after charging of the capacitive element 208 (following time t2).

As indicated above, FIG. 3 is provided as an example. Other examples may differ from what is described with regard to FIG. 3.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A driver circuit, comprising:
   an optical emitter;
   a capacitive element connected to the optical emitter;
   an inductive element connected to the capacitive element;
   a first switch having an open state and a closed state,
      wherein the first switch in the closed state is to cause charging of the inductive element,
      wherein the first switch is configured to transition from the open state to the closed state based on a rising edge of a pulse of a first electrical signal, and
      wherein the first switch transitioning from the closed state to the open state is to cause discharging of the inductive element to charge the capacitive element;
   a second switch having an open state and a closed state,
      wherein the second switch in the closed state is to cause discharging of the capacitive element to provide an electrical pulse to the optical emitter, and
      wherein the second switch is configured to transition from the open state to the closed state based on a rising edge of a pulse of a second electrical signal;
   a signal generator configured to generate the first electrical signal for controlling the open state and the closed state of the first switch; and
   a pulse shortening element configured to shorten a pulse width of the first electrical signal to generate the second electrical signal for controlling the open state and the closed state of the second switch,
      wherein the rising edge of the pulse of the first electrical signal is configured to coincide with the rising edge of the pulse of the second electrical signal.

2. The driver circuit of claim 1, further comprising:
   a voltage peak detection circuit configured to detect a voltage level at the capacitive element.

3. The driver circuit of claim 1, further comprising:
   a current sense resistive element in series between the inductive element and the optical emitter.

4. The driver circuit of claim 1, wherein a capacitance value of the capacitive element and a pulse width of the second electrical signal are configured such that, after the electrical pulse is provided to the optical emitter, a difference between an anode side voltage of the optical emitter and a cathode side voltage of the optical emitter is less than a forward voltage threshold of the optical emitter.

5. The driver circuit of claim 1, wherein the electrical pulse is Gaussian-shaped.

6. The driver circuit of claim 1, wherein the first switch and the second switch are field effect transistors.

7. The driver circuit of claim 1, wherein, in response to the electrical pulse, the optical emitter is to emit an optical pulse having a width greater than or equal to 1 nanosecond and less than or equal to 7 nanoseconds.

8. The driver circuit of claim 1, further comprising:
   at least one set of electrical test points for obtaining a measurement relating to a voltage or a current of the driver circuit.

9. The driver circuit of claim 8, wherein the at least one set of electrical test points comprises:
   a first set of electrical test points that include a first electrical test point at an input side of a current sense resistive element and a second electrical test point at an output side of the current sense resistive element; and
   a second set of electrical test points that include a first electrical test point at an input side of the optical emitter and a second electrical test point at an output side of the optical emitter.

10. A vertical cavity surface emitting laser (VCSEL) evaluation system, comprising:
    a VCSEL;
    a capacitive element connected to the VCSEL;
    a voltage booster element connected to the capacitive element,
       wherein the voltage booster element includes an inductive element;
    a first switch having an open state and a closed state,
       wherein the first switch in the closed state is to cause charging of the inductive element, wherein the first switch is configured to transition from the open state to the closed state based on a rising edge of a pulse of a first electrical signal, and wherein the first switch transitioning from the closed state to the open state is to cause discharging of the inductive element to charge the capacitive element;

a second switch having an open state and a closed state,
wherein the second switch in the closed state is to cause discharging of the capacitive element to provide an electrical pulse to the VCSEL, and wherein the second switch is configured to transition from the open state to the closed state based on a rising edge of a pulse of a second electrical signal;

a signal generator configured to generate the first electrical signal for controlling the open state and the closed state of the first switch;

a pulse shortening element configured to shorten a pulse width of the first electrical signal to generate the second electrical signal for controlling the open state and the closed state of the second switch, wherein the rising edge of the pulse of the first electrical signal is configured to coincide with the rising edge of the pulse of the second electrical signal;

a current sense resistive element in series between the voltage booster element and the VCSEL; and a voltage peak detection circuit configured to detect a voltage level at the capacitive element.

11. The VCSEL evaluation system of claim 10, wherein a capacitance value of the capacitive element and a pulse width of the second electrical signal are configured such that, after the electrical pulse is provided to the VCSEL, a difference between an anode side voltage of the VCSEL and a cathode side voltage of the VCSEL is less than a forward voltage threshold of the VCSEL.

12. The VCSEL evaluation system of claim 10, further comprising:
a first set of electrical test points for obtaining a measurement relating to a voltage at the VCSEL; and
a second set of electrical test points for obtaining a measurement relating to a current from the inductive element.

13. The VCSEL evaluation system of claim 12, wherein the first set of electrical test points comprises a first electrical test point at an input side of the current sense resistive element and a second electrical test point at an output side of the current sense resistive element; and
wherein the second set of electrical test points comprises a first electrical test point at an input side of the VCSEL and a second electrical test point at an output side of the VCSEL.

14. The VCSEL evaluation system of claim 10, wherein the electrical pulse is Gaussian-shaped.

15. An optical source, comprising:
a vertical cavity surface emitting laser (VCSEL);
a capacitive element connected to the VCSEL;
a voltage booster element connected to the capacitive element,
wherein the voltage booster element includes an inductive element;
a first switch having an open state and a closed state,
wherein the first switch in the closed state is to cause charging of the inductive element,
wherein the first switch is configured to transition from the open state to the closed state based on a rising edge of a pulse of a first pulse width modulation (PWM) electrical signal, and
wherein the first switch transitioning from the closed state to the open state is to cause discharging of the inductive element to charge the capacitive element;
a second switch having an open state and a closed state,
wherein the second switch in the closed state is to cause discharging of the capacitive element to provide an electrical pulse to the VCSEL, and
wherein the second switch is configured to transition from the open state to the closed state based on a rising edge of a pulse of a second PWM electrical signal;
a signal generator configured to generate the first PWM electrical signal for controlling the open state and the closed state of the first switch; and
a pulse shortening element configured to shorten a pulse width of the first PWM electrical signal to generate the second PWM electrical signal for controlling the open state and the closed state of the second switch,
wherein the rising edge of the pulse of the first PWM electrical signal is configured to coincide with the rising edge of the pulse of the second PWM electrical signal.

16. The optical source of claim 15, wherein the voltage booster element further includes a blocking diode in series between the capacitive element and the inductive element.

17. The optical source of claim 15, further comprising:
a voltage source of less than 20 volts.

18. The optical source of claim 15, further comprising:
a gate driver configured to receive the second PWM electrical signal from the pulse shortening element and to drive a gate of the second switch based on the second PWM electrical signal.

19. The optical source of claim 15,
wherein a falling edge of the pulse of the first PWM electrical signal does not coincide with a falling edge of the pulse of the second PWM electrical signal.

20. The optical source of claim 15, wherein a capacitance value of the capacitive element and a pulse width of the second PWM electrical signal are configured such that, after the electrical pulse is provided to the VCSEL, a difference between an anode side voltage of the VCSEL and a cathode side voltage of the VCSEL is less than a forward voltage threshold of the VCSEL.

* * * * *